(12) United States Patent
Sylvestre

(10) Patent No.: US 8,932,909 B2
(45) Date of Patent: Jan. 13, 2015

(54) THERMOCOMPRESSION FOR SEMICONDUCTOR CHIP ASSEMBLY

(71) Applicant: International Business Machines Corporation, Armonk, NY (US)

(72) Inventor: Julien Sylvestre, Chambly (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/676,250

(22) Filed: Nov. 14, 2012

(65) Prior Publication Data

US 2014/0131855 A1    May 15, 2014

(51) Int. Cl.
*H01L 21/00* (2006.01)

(52) U.S. Cl.
USPC ............................................ 438/108

(58) Field of Classification Search
USPC .................................. 438/108, 127
See application file for complete search history.

(56) References Cited

U.S. PATENT DOCUMENTS

| | | | |
|---|---|---|---|
| 6,121,576 | A | 9/2000 | Hembree et al. |
| 6,207,475 | B1 * | 3/2001 | Lin et al. ...................... 438/108 |
| 6,326,234 | B1 | 12/2001 | Nakamura |
| 6,326,241 | B1 | 12/2001 | Belke, Jr. et al. |
| 6,614,003 | B2 | 9/2003 | Hembree et al. |
| 6,674,178 | B1 | 1/2004 | Ikegami |
| 6,967,307 | B2 | 11/2005 | Hembree et al. |
| 6,981,317 | B1 | 1/2006 | Nishida |
| 7,040,012 | B2 | 5/2006 | Eslampour |
| 7,156,284 | B2 | 1/2007 | Rinne et al. |
| 7,276,924 | B2 | 10/2007 | Maruyama et al. |
| 7,656,042 | B2 * | 2/2010 | Lii et al. ........................ 257/778 |
| 8,044,524 | B2 | 10/2011 | Nagai |
| 2002/0072151 | A1 * | 6/2002 | Amami et al. ................. 438/108 |
| 2004/0047127 | A1 | 3/2004 | Yamauchi et al. |
| 2004/0135265 | A1 * | 7/2004 | Zakel et al. .................... 257/782 |
| 2004/0155358 | A1 | 8/2004 | Iijima |
| 2004/0185602 | A1 | 9/2004 | Chaudhuri et al. |
| 2009/0155955 | A1 * | 6/2009 | Liang ............................ 438/108 |

FOREIGN PATENT DOCUMENTS

| | | |
|---|---|---|
| JP | 1226161 | 9/1989 |
| JP | 2000058597 A | 2/2000 |
| JP | 2003533870 A | 11/2003 |

OTHER PUBLICATIONS

PCT Application No. PCT/US2013/068630 Filed Nov. 6, 2013 International Search Report and Written Opinion.

* cited by examiner

*Primary Examiner* — Reema Patel
(74) *Attorney, Agent, or Firm* — Keivan Razavi; Catherine Ivers

(57) ABSTRACT

A method of assembling a semiconductor chip to a substrate wherein at least one of the semiconductor chip and substrate comprise solder bumps. The method includes aligning the semiconductor chip with the substrate; applying a compression force to the semiconductor chip to cause the solder bumps to deform between the semiconductor chip pads and the substrate pads, the compression force being applied while the semiconductor chip and substrate are held at a temperature above room temperature and below a temperature at which any liquid will form in at least one of the solder bumps; then applying an underfill material to fill the gap between the chip and substrate; and then heating the assembled semiconductor chip and substrate to an elevated temperature to cause the solder bumps to melt and reflow and form a metallurgical bond between the semiconductor chip pads and the substrate pads.

24 Claims, 6 Drawing Sheets

THERMOCOMPRESSION FOR SEMICONDUCTOR CHIP ASSEMBLY

BACKGROUND

The present exemplary embodiments relate to the joining of semiconductor chips to substrates to form semiconductor packages and, more particularly, relate to the thermocompression of solder bumps for a temporary mechanical join between the semiconductor chip and the substrate pads prior to the dispensing of an underfill material.

In a typical assembly process, a semiconductor chip is aligned with the pads on a substrate and then the solder bumps on the semiconductor chip are heated to cause reflow of the solder bumps and form a metallurgical join to the substrate pads. An underfill material may then be dispensed between the semiconductor chip and substrate.

A simpler process would be desirable that is suitable for a high volume manufacturing operation.

BRIEF SUMMARY

The various advantages and purposes of the exemplary embodiments as described above and hereafter are achieved by providing, according to a first aspect of the exemplary embodiments, a method of assembling a semiconductor chip to a substrate including: providing a semiconductor chip having pads; providing a substrate having pads to receive the semiconductor chip; providing solder bumps on at least one of the semiconductor chip pads and substrate pads; aligning the semiconductor chip pads with the substrate pads; applying a compression force to the semiconductor chip to cause the solder bumps to deform against, and make contact with, the substrate pads and the semiconductor chip pads, the compression force being applied while the semiconductor chip and substrate are held at a temperature above room temperature and below a temperature at which any liquid will form in at least one of the solder bumps; after applying a compression force, applying an underfill material to fill the gap between the semiconductor chip and the substrate, the underfill material not penetrating between the deformed solder bumps, the semiconductor chip pads and the substrate pads; and after applying the underfill material, heating the assembled semiconductor chip and substrate to an elevated temperature to cause the solder bumps to melt and reflow and form a plurality of metallurgical bonds between the semiconductor chip pads and the substrate pads.

According to a second aspect of the exemplary embodiments, there is provided a method of assembling a semiconductor chip having pads to a substrate having pads to receive the semiconductor chip, at least one of the semiconductor chip pads and substrate pads having solder bumps. The method including: aligning the semiconductor chip with the substrate; applying a compression force to the semiconductor chip to cause the solder bumps to deform against, and make contact with, the substrate pads and the semiconductor chip pads, the compression force being applied while the semiconductor chip and substrate are held at a temperature above room temperature and below a temperature at which any liquid will form in at least one of the solder bumps; performing an electrical test on the semiconductor chip or substrate that requires at least one electrical function of the semiconductor chip to be functional; after performing an electrical test, applying an underfill material to fill the gap between the substrate and the semiconductor chip, the underfill material not penetrating between the deformed solder bumps, the semiconductor chip pads and substrate pads; and after applying an underfill material, heating the assembled semiconductor chip and substrate to an elevated temperature to cause the solder bumps to melt and reflow and form a metallurgical bond between the semiconductor chip pads and the substrate pads.

According to a third aspect of the exemplary embodiments, there is provided an assembly of a semiconductor chip having pads to a substrate having pads aligned to receive the semiconductor chip, at least one of the semiconductor chip pads and substrate pads having solder bumps, the solder bumps being deformed against the substrate pads and the semiconductor chip pads, an underfill material applied to fill the gap between the semiconductor chip and substrate such that the underfill material does not penetrate between the deformed solder bumps, the semiconductor chip pads and substrate pads, wherein at least one of the solder bumps have not been melted or reflowed to make a metallurgical bond between the semiconductor chip and the substrate pads.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Figure 1A:
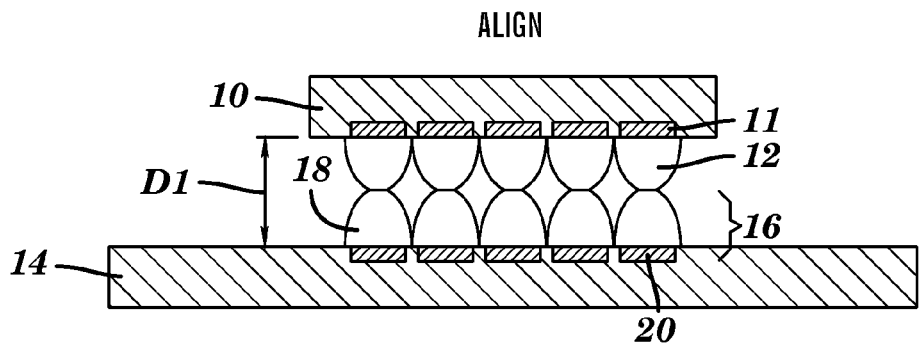
FIGS. 1A to 1E are partial cross-sectional views illustrating a preferred sequence of processes for practicing the exemplary embodiments.

Referring to FIGS. 1A to 1E in more detail, and particularly referring to FIG. 1A, there is shown a semiconductor chip 10 having input/output (I/O) pads 11 and solder bumps 12 and a substrate 14 having pads 16. The pads 16 may include connection pads 20 and solder bumps 18. As will be explained hereafter, in some exemplary embodiments, the I/O pads 11 may not include the solder bumps 12 and, further, the pads 16 may just include the connection pads 20 or alternatively, the pads 16 may include solder bumps 18 as well.

The substrate 14 may include any substrate in use today or in the future including ceramic substrates; Flip Chip Ball Grid Array (FCBGA) substrates constructed by laminating a dielectric, copper and fiberglass layers; plastic substrates, fiberglass/epoxy substrates (FR-4), etc.

In practice, the solder bumps 12 of semiconductor chip 10 are aligned with pads 16 of substrate 14. During the alignment process in FIG. 1A, it may be desirable to heat the semiconductor chip 10 and substrate 14 to about 150° C. (or higher, as long as the solder bumps 12, 18 on the semiconductor chip 10 and the substrate 14 do not all melt or form a liquid).

When semiconductor chip 10 is aligned with substrate 14 so that solder bumps 12 are just touching pads 16, the semiconductor chip 10 and semiconductor package 14 may be separated by a distance D1.

While solder bumps 12 are shown touching pads 16 in FIG. 1A for the purpose of illustrating distance D1, the solder bumps 12 and pads 16 may not actually touch during alignment.

Figure 1B:
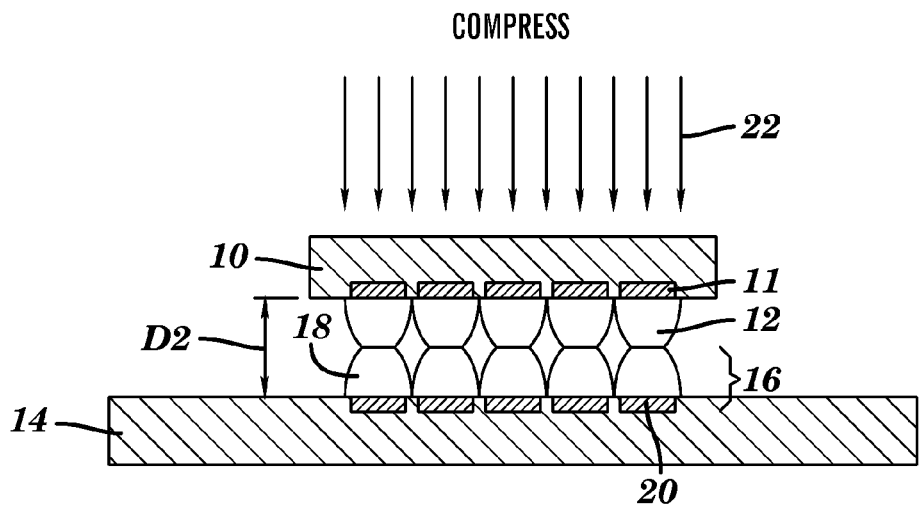

Referring now to FIG. 1B, the semiconductor chip 10 and substrate 14 are heated to an elevated temperature in the range of 150° C. to a temperature that is just below the temperature at which liquid will form in the solder of the semiconductor chip bumps 12 or substrate pads 16. That is, liquid may form in the solder of some of the semiconductor chip bumps 12 or liquid may form in the solder of some of the substrate pads 16 but liquid may not form in all bumps, so that at least two bumps are compressed against each while in a solid state. It is also within the scope of the exemplary embodiments for liquid to form in neither of the semiconductor chips bumps 12 or substrate pads 16 so long as the temperature is high enough to soften the solder bumps. For eutectic solders, the high point of the temperature range will be just below the eutectic point and for non-eutectic solders, the high point of the temperature range will be just below the solidus. The solidus is a curve on a phase diagram of the solder below which a solder is completely solid.

While heated, a suitable compression force, indicated by arrows 22, of 5 to 25 grams per solder bump may be applied to cause the solder bumps 12 to deform against the pads 16. The amount of compression force may be varied to adjust the final shape of the solder bumps 12 and pads 16 to form a temporary mechanical join. Lower compression forces may be used for the same final shape if higher temperatures or longer compression times are used.

After application of the compression force 22, the semiconductor chip 10 and substrate 14 are now separated by a distance D2 where D2 is less than D1. In a preferred exemplary embodiment, D2 may 5 to 75% of D1 and in a most preferred embodiment, D2 may be 25 to 50% of D1.

Figure 2:
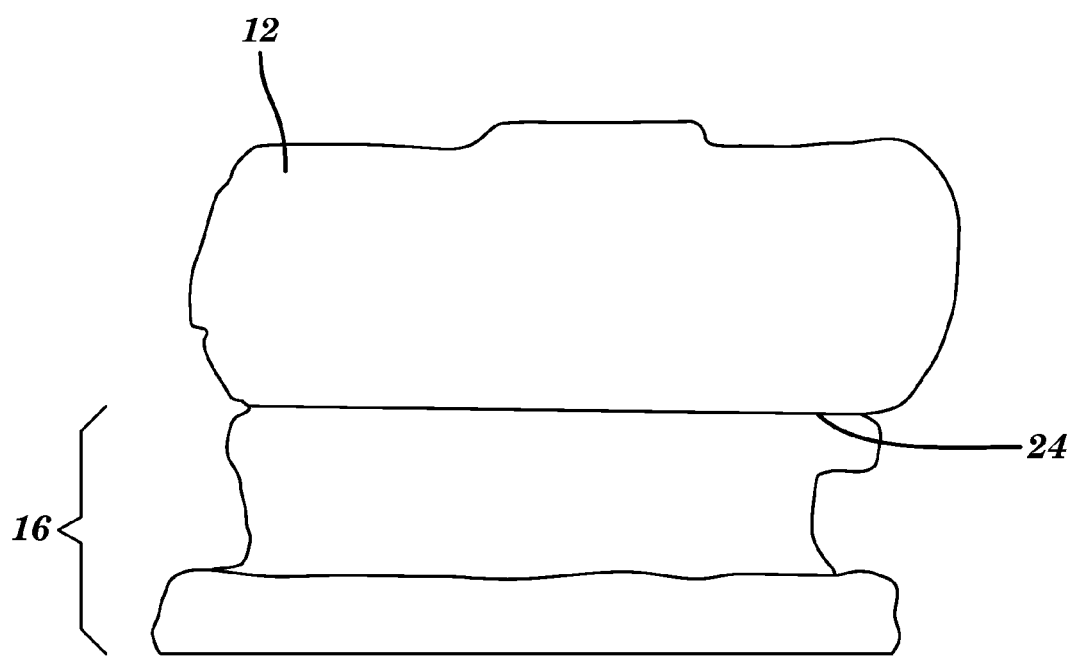
FIG. 2 is a side view of a deformed solder bump after thermocompression according to the exemplary embodiments.

FIG. 2 schematically illustrates the solder bumps 12 and pads 16 after compression. Where the solder bumps 12 and pads 16 had a substantially hemispherical shape as shown in FIG. 1A, the solder bumps 12 and pads 16 are now deformed and flattened. Between the solder bumps 12 and pads 16 is a thin interface 24. While the solder bumps 12 and pads 16 are now in just mechanical contact, the interface 24 is sufficiently tight such that the underfill which is dispensed in a subsequent step cannot penetrate the interface 24 by capillarity. While it is believed there is no metallurgical join formed between the solder bumps 12 and pads 16, there is some sticking together of the solder bumps 12 and pads 16 such that if the semiconductor chip 10 is pulled apart from the semiconductor package 14 after compression 22, there is some force required to pull the semiconductor chip 10 and substrate 14 apart. This force may simply arise from some mechanical interlocking of the solder bumps 12 and pads 16 together, although it is not known at this time whether other physical or chemical mechanisms may be activated in this process to increase the bonding force.

Returning back to FIG. 1B, the compression force 22 is preferably applied for only about 1 second to cause deformation of the solder bumps 12 and pads 16. Much longer hold times may not offer any advantages, although in some cases hold times of 5 seconds or more might be used.

Figure 1C:
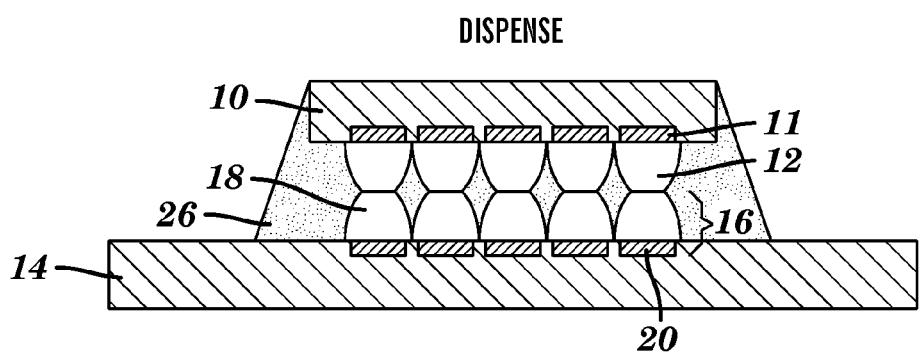

Referring now to FIG. 1C, the assembly of semiconductor chip 10 and substrate 14 may be cooled to about 110° C. and then a conventional underfill material 26 may be dispensed into the gap volume between the semiconductor chip 10 and substrate 14 so as to envelop the solder bumps 12 and pads 16. An example of a conventional underfill material might be an epoxy resin filled with small silica spheres. Even though there is no apparent metallurgical bond between the solder bumps 12 and pads 16, there is no or very little penetration of underfill material 26 into interface 24 (FIG. 2) between solder bumps 12 and pads 16.

Figure 1D:
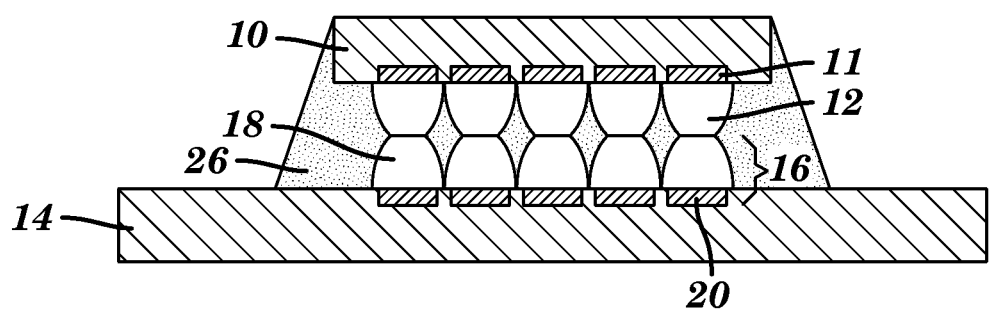

The underfill material 26 may be cured at a temperature suitable for the underfill material 26 as indicated in FIG. 1D. One such temperature may be around 150° C.

Figure 1E:
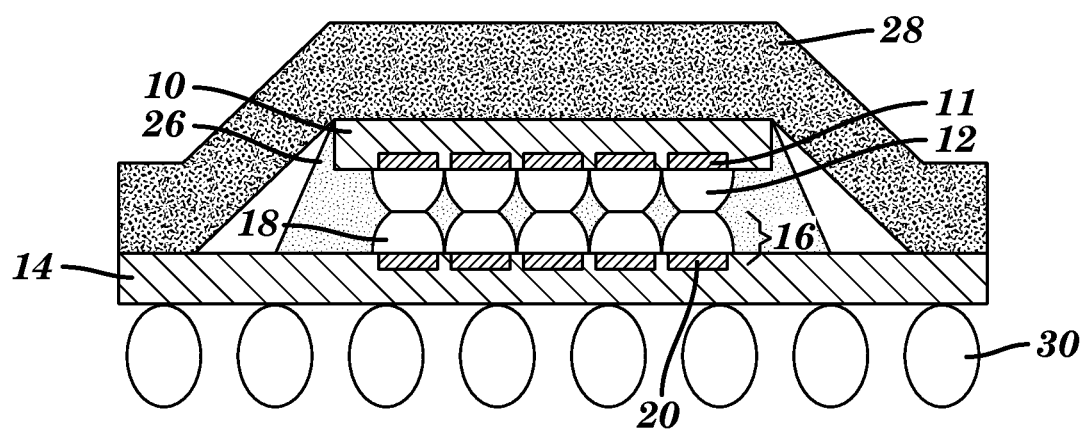

Referring now to FIG. 1E, the assembled semiconductor chip 10 and substrate 14 undergo a reflow operation to melt the solder bumps 12 and pads 16 and form a metallurgical bond. A solder flux is unnecessary for the reflow process although a flux may be added earlier, such as before the application of the compression force 22, to improve the rate of formation of the metallurgical bond. An advantage of the exemplary embodiments is that if there is included a cap 28 over the semiconductor chip 10, the reflow of the solder bumps 12 and pads 16 may occur after the cap 28 is attached. A further advantage of the exemplary embodiments is that if solder balls 30 are added to the substrate 14, the reflow of the solder bumps 12 and pads 16 may occur at the same time as the reflow of the solder balls 30.

Figure 3:
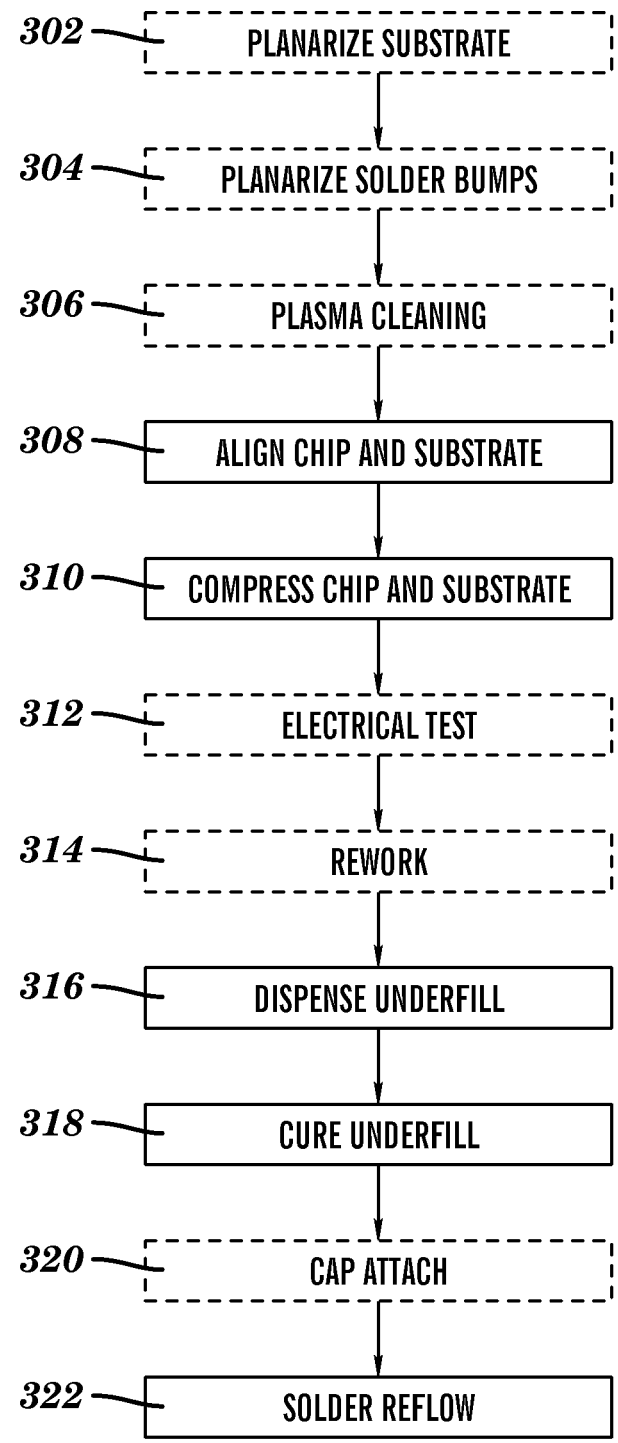
FIG. 3 is a flow chart of a method for practicing the exemplary embodiments.

Referring now to FIG. 3, there is illustrated a flow chart of a method for practicing the exemplary embodiments. Processes that are outlined in dotted lines are optional processes. In a first optional process, box 302, the substrate may be planarized. Planarizing may be by, for example, pressing a flat, heated surface against the solder bumps of the pads so as to impart a flat surface to the solder bumps.

In another optional process, box 304, the solder bumps on the semiconductor chip may be planarized by, for example, pressing a flat, heated surface against the solder bumps so as to impart a flat surface to the solder bumps.

In yet another optional process, box 306, the semiconductor chip and substrate may be cleaned, for example, by a plasma process to reduce or eliminate any contaminant on the surface of the semiconductor chip, the substrate, the pads or the solder. The plasma process may also have a positive impact on the flow or the adhesion of the capillary underfill. An example of a plasma process is exposing the components to a reactive-ion etching (RIE) low-pressure oxygen plasma for about 30 seconds.

Next, box 308, the semiconductor chip and substrate may be aligned as described previously with respect to FIG. 1A. A tacking agent such as a polymeric material may be used to maintain the alignment in the following processes.

A compression force may then be applied to the semiconductor chip and substrate to cause deformation of the solder bumps on the semiconductor chip and deformation of the pads on the substrate, box 310, as also described previously with respect to FIG. 1B.

It may be desirable to test, electrically or otherwise, the assembled semiconductor chip and substrate, box 312. The solder bumps on the semiconductor chip and the pads on the substrate may be in sufficiently good mechanical contact after the compression process described above such that an electrical test may be conducted through the solder bumps on the semiconductor chip and the pads on the substrate. It may not be necessary to have 100% electrical continuity as substantial electrical continuity (less than 100% electrical continuity) between one of the semiconductor chip pads and one of the substrate pads may be sufficient for certain types of testing. Additional testing may include testing the intrinsic functionality of the semiconductor chip and substrate.

If after the testing just described, it is determined that the semiconductor chip or substrate are defective, either may be easily replaced in a reworking process by separating the semiconductor chip from the substrate and then starting the process over, such as by planarizing the substrate or the solder bumps on the semiconductor chip or by aligning the semiconductor chip and substrate.

Next, underfill material may be dispensed as indicated in box 316 followed by curing the underfill in box 318.

In an optional process, box 320, a cap or solder balls may be attached as described previously with respect to FIG. 1E.

Lastly, there is solder reflow, box 322, of the semiconductor chip solder bumps and the substrate pads. If there are solder balls, such as solder balls 30 in FIG. 1E, the solder balls may also be reflowed at this time.

Referring now to FIGS. 4A to 4F, there are illustrated various exemplary embodiments of the solder bumps with respect the semiconductor chip and the pads on the substrate.

In the various other embodiments shown in FIGS. 4A to 4F, the solder bumps may be on the semiconductor chip only, the substrate only or both the semiconductor chip and substrate. Then, the solder bumps are deformed between the semiconductor chip and substrate so as to make contact with the semiconductor chip I/O pads and substrate connection pads.

Any solder may be used in the exemplary embodiments including leaded solders and, more preferably, lead-free solders.

The temperature during compression in these various other embodiments may be such as to avoid the formation of liquid in the solder bumps if they are only on the semiconductor chip or only on the substrate. If the solder bumps are on both the semiconductor chip and substrate, the temperature during compression may be such as to avoid the formation of liquid in both the solder bumps on the semiconductor chip and the solder bumps on the substrate.

Figure 4A:
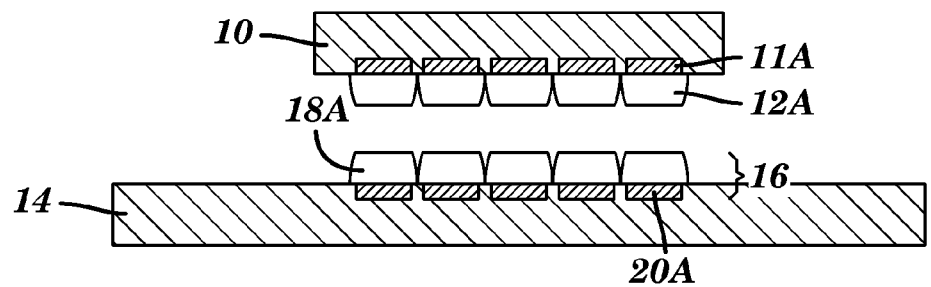
FIGS. 4A to 4F are partial cross-sectional views illustrating various exemplary embodiments of the solder bumps with respect to the semiconductor chip and the substrate pads.

In FIG. 4A, solder bumps 12A joined to I/O pads 11A on semiconductor chip 10 and/or solder bumps 18A joined to connection pads 20A on substrate 14 may be planarized by, for example, pressing a flat, heated surface on the solder bumps 12A or 18A. Solder bumps 12A and/or 18A now have a flat surface which may facilitate the method of the exemplary embodiments.

Figure 4B:
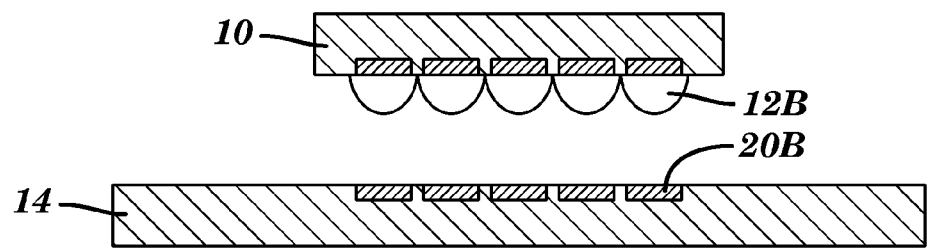

Alternatively, as shown in FIG. 4B, the solder bumps on substrate 14 may be dispensed with so that solder bumps 12B on semiconductor chip 10 are joined directly to substrate connection pads 20B.

Figure 4C:
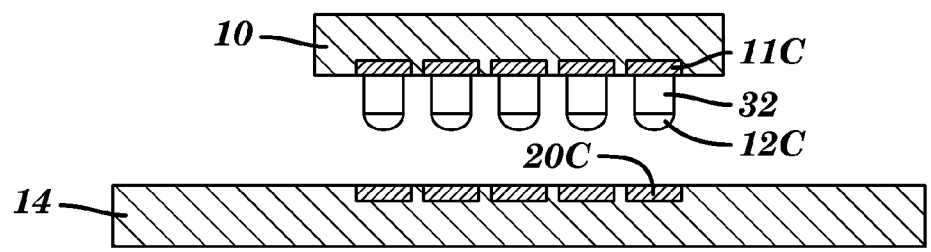

In place of the solder bumps on semiconductor chip 10, there may be copper pillars 32 joined to I/O pads 11C and having solder bumps 12C on the ends of the copper pillars 32 as shown in FIG. 4C. The solder bumps 12C may be joined directly to connection pads 20C.

Figure 4D:
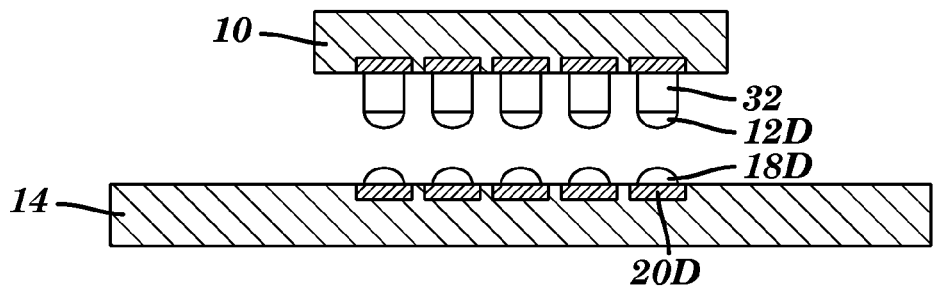

In another exemplary embodiment as shown in FIG. 4D, solder bumps 12D on copper pillars 32 may be joined to solder bumps 18D on connection pads 20D.

Figure 4E:
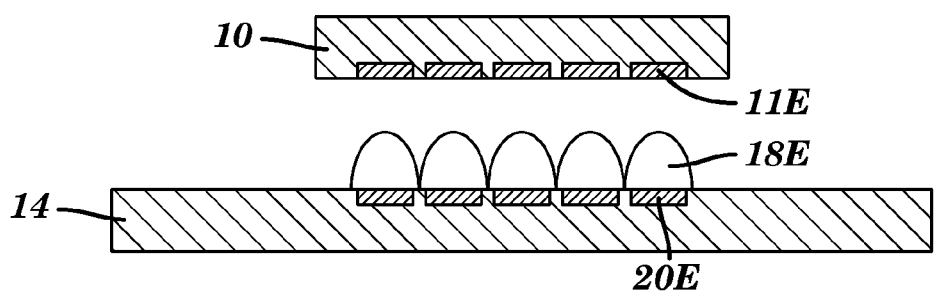

In a further exemplary embodiment as shown in FIG. 4E, there may be solder bumps 18E only on substrate connection pads 20E so that the semiconductor chip 10 is joined directly to solder bumps 18E. Semiconductor chip 10 may have I/O pads 11E for receiving the solder bumps 18E.

Figure 4F:
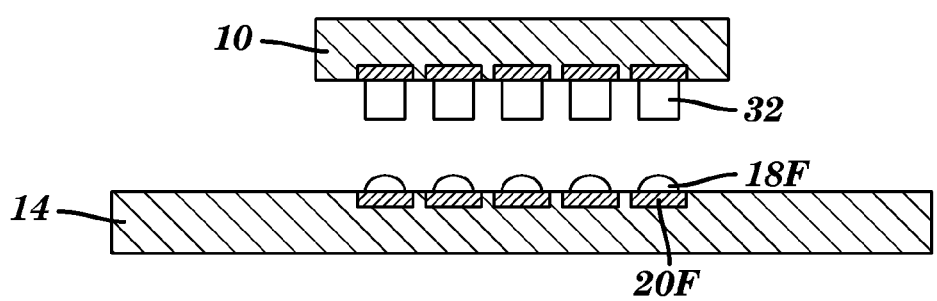

In yet another exemplary embodiment as shown in FIG. 4F, semiconductor chip 10 may have copper pillars 32 but in this exemplary embodiment, there are only solders bumps 18F on substrate connection pads 20F.

Included within the exemplary embodiments is an assembly of a semiconductor chip having pads to a substrate having pads aligned to receive the semiconductor chip. At least one of the semiconductor chip pads and substrate pads have solder bumps. The solder bumps are deformed against the substrate pads and the semiconductor chip pads. An underfill material may be applied to fill the gap between the semiconductor chip and substrate such that the underfill material does not penetrate between the deformed solder bumps, the semiconductor chip pads and the substrate pads. At least one of the solder bumps between the semiconductor chip pads and substrate pads have not been melted or reflowed to make a metallurgical bond between the semiconductor chip pads and the substrate pads.

The assembly of the semiconductor chip and substrate may include any of the embodiments disclosed in FIGS. 1A to 1E and FIGS. 4A to 4F.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of assembling a semiconductor chip to a substrate comprising:
   providing a semiconductor chip having pads;
   providing a substrate having pads to receive the semiconductor chip;
   providing solder bumps on at least one of the semiconductor chip pads and substrate pads;
   aligning the semiconductor chip pads with the substrate pads;
   applying a compression force to the semiconductor chip to cause the solder bumps to deform against, and make contact with, the substrate pads and the semiconductor chip pads, the compression force being applied while the semiconductor chip and substrate are held at a temperature above room temperature and below a temperature at which any liquid will form in at least one of the solder bumps;
   after applying a compression force, applying an underfill material to fill the gap between the semiconductor chip and the substrate, the underfill material enveloping both the deformed solder bumps and the substrate pads, the underfill material not penetrating between the deformed solder bumps, the semiconductor chip pads and the substrate pads based on the applying of the compression force; and
   after applying the underfill material, heating the assembled semiconductor chip and substrate to an elevated temperature to cause the solder bumps to melt and reflow and form a plurality of metallurgical bonds between the semiconductor chip pads and the substrate pads.

2. The method of claim 1 wherein only the substrate comprises solder bumps and during the step of applying a compression force, the temperature during compression is below a temperature at which any liquid will form in the solder bumps.

3. The method of claim 1 wherein only the semiconductor chip comprises solder bumps and during the step of applying a compression force, the temperature during compression is below a temperature at which any liquid will form in the solder bumps.

4. The method of claim 1 wherein the semiconductor chip and substrate both comprise solder bumps and during the step of applying a compression force, the temperature during compression is below a temperature at which any liquid will form in at least one of the semiconductor chip solder bumps and substrate solder bumps.

5. The method of claim 1 wherein the semiconductor chip further comprises copper pillars extending from the semiconductor chip pads and the solder bumps are on ends of the copper pillars.

6. The method of claim 5 further comprising solder bumps on the substrate pads.

7. The method of claim 1 wherein the semiconductor chip further comprises copper pillars extending from the semiconductor chip pads, the copper pillars being devoid of solder bumps, and the solder bumps are on the substrate pads.

8. The method of claim 1 wherein between applying a compression force and applying an underfill material, further comprising performing an electrical test on the semiconductor chip or substrate that requires substantial electrical continuity of one of the semiconductor chip pads to one of the substrate pads.

9. The method of claim 1 wherein between applying a compression force and applying an underfill material, further comprising reworking the semiconductor chip by replacing the semiconductor chip with another semiconductor chip.

10. The method of claim 1 wherein applying a compression force causes a gap between the semiconductor chip and substrate to decrease by 25 to 50 percent.

11. The method of claim 1 wherein in applying a compression force comprising applying the compression force for about 1 second.

12. The method of claim 1 wherein between applying the underfill material and the heating causing the solder bumps to melt and reflow, further comprising adding a cap to the semiconductor chip and substrate.

13. The method of claim 1 wherein between applying an underfill material and heating, further comprising adding solder balls to an underside of the substrate followed by the heating step to additionally melt and reflow the substrate solder balls.

14. A method of assembling a semiconductor chip having pads to a substrate having pads to receive the semiconductor chip, at least one of the semiconductor chip pads and substrate pads having solder bumps comprising:
   aligning the semiconductor chip with the substrate;
   applying a compression force to the semiconductor chip to cause the solder bumps to deform against, and make contact with, the substrate pads and the semiconductor chip pads, the compression force being applied while the semiconductor chip and substrate are held at a temperature above room temperature and below a temperature at which any liquid will form in at least one of the solder bumps;
   performing an electrical test on the semiconductor chip or substrate that requires at least one electrical function of the semiconductor chip to be functional;
   after performing an electrical test, applying an underfill material to fill the gap between the substrate and the semiconductor chip, the underfill material enveloping both the deformed solder bumps and the substrate pads, the underfill material not penetrating between the deformed solder bumps, the semiconductor chip pads and substrate pads based on the applying of the compression force; and
   after applying an underfill material, heating the assembled semiconductor chip and substrate to an elevated temperature to cause the solder bumps to melt and reflow and form a metallurgical bond between the semiconductor chip pads and the substrate pads.

15. The method of claim 14 wherein only the substrate comprises solder bumps and during the step of applying a compression force, the temperature during compression is below a temperature at which any liquid will form in the solder bumps.

16. The method of claim 14 wherein only the semiconductor chip comprises solder bumps and during the step of applying a compression force, the temperature during compression is below a temperature at which any liquid will form in the solder bumps.

17. The method of claim 14 wherein the semiconductor chip and substrate both comprise solder bumps and during the step of applying a compression force, the temperature during compression is below a temperature at which any liquid will form in at least one of the semiconductor chip solder bumps and substrate solder bumps.

18. The method of claim 14 wherein the semiconductor chip further comprises copper pillars extending from the semiconductor chip pads and the solder bumps are on ends of the copper pillars.

19. The method of claim 18 further comprising solder bumps on the substrate pads.

20. The method of claim 14 wherein the semiconductor chip further comprises copper pillars extending from the semiconductor chip pads, the copper pillars being devoid of solder bumps, and the solder bumps are on the substrate.

21. The method of claim 14 wherein between applying a compression force and applying an underfill material, further comprising reworking the semiconductor chip by replacing the semiconductor chip with another semiconductor chip.

22. The method of claim 14 wherein applying a compression force causes a gap between the semiconductor chip and substrate to decrease by 25 to 50 percent.

23. The method of claim 14 wherein between applying an underfill material and heating, further comprising adding a cap to the semiconductor chip and substrate.

24. The method of claim 14 wherein between applying an underfill material and heating, further comprising adding solder balls to an underside of the substrate followed by the heating step to additionally melt and reflow the substrate solder balls.

* * * * *